(12) United States Patent
Huang

(10) Patent No.: US 10,453,529 B2
(45) Date of Patent: Oct. 22, 2019

(54) RESISTIVE RANDOM ACCESS MEMORY (RRAM) DEVICE, WRITE VERIFY METHOD AND REVERSE WRITE VERIFY METHOD THEREOF

(71) Applicant: Winbond Electronics Corp., Taichung (TW)

(72) Inventor: Koying Huang, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/829,987

(22) Filed: Dec. 4, 2017

(65) Prior Publication Data

US 2019/0172534 A1    Jun. 6, 2019

(51) Int. Cl.
  *G11C 13/00* (2006.01)
(52) U.S. Cl.
  CPC ...... *G11C 13/0064* (2013.01); *G11C 13/0061* (2013.01); *G11C 13/0069* (2013.01); *G11C 13/0097* (2013.01); *G11C 2013/0054* (2013.01); *G11C 2013/0066* (2013.01); *G11C 2013/0073* (2013.01)
(58) Field of Classification Search
  CPC .. G11C 13/0064; G11C 13/0069; G11C 13/00
  USPC ........................................................ 365/148
  See application file for complete search history.

(56) References Cited

U.S. PATENT DOCUMENTS

| 8,059,450 | B2 | 11/2011 | Xi et al. | |
|---|---|---|---|---|
| 8,699,258 | B2* | 4/2014 | Chien | G11C 7/1045 |
| | | | | 365/148 |
| 9,721,637 | B2* | 8/2017 | Houssameddine | G11C 11/16 |
| 2008/0123389 | A1* | 5/2008 | Cho | G11C 11/56 |
| | | | | 365/148 |
| 2011/0026302 | A1* | 2/2011 | Xi | G11C 11/5664 |
| | | | | 365/148 |
| 2015/0287459 | A1* | 10/2015 | Navon | G11C 13/0069 |
| | | | | 365/148 |

FOREIGN PATENT DOCUMENTS

| CN | 104299645 | 1/2015 |
|---|---|---|
| TW | I449050 | 8/2014 |

* cited by examiner

*Primary Examiner* — Amir Zarabian
*Assistant Examiner* — Muna A Techane
(74) *Attorney, Agent, or Firm* — JCIPRNET

(57) ABSTRACT

This invention introduces a resistive random access memory (RRAM) device, a write verify method and a reverse write verify thereof which are capable of improving the performance of RRAM operations and improving the uniform performance for each RRAM cell. A first resistance value sensed from a RRAM cell is compared with a plurality of reference resistance values to obtain a comparison value. A set or a reset operation is performed on the RRAM cell by applying a first set or reset pulse to change the first resistance value to a second resistance value. Next, the second resistance value is compared with the comparison value to determine whether to continue the set or reset operation on the RRAM cell.

16 Claims, 8 Drawing Sheets

RESISTIVE RANDOM ACCESS MEMORY (RRAM) DEVICE, WRITE VERIFY METHOD AND REVERSE WRITE VERIFY METHOD THEREOF

BACKGROUND OF THE INVENTION

1. Field of the Invention

The invention relates to a memory device, and particularly relates to a resistive random access memory (RRAM) device, a write verify method and a reverse write verify which are capable of saving power consumption, improving the performance of RRAM operations and improving the uniform performance for each RRAM cell.

2. Description of Related Art

RRAM devices are applied to a wide variety of electronic equipment, such as digital camera, smartphone, etc. To satisfy market's demands, the RRAM device is required to be small in volume and large in capacity, and is further required to have high speed, low power consumption and high reliability in storing information.

During a write or a reverse write operation on a RRAM cell, a verifying operation is performed to determine whether the resistance value of the RRAM cell reaches a target resistance value. When the resistance value of the RRAM cell reaches the target resistance value, the write or reverse write operation is successful. Otherwise, when the resistance value of the RRAM cell does not reach the target resistance value after a predetermined write or reverse write pulses (or a predetermined time period), the write or reverse write operation is failed.

However, in the write or reverse operation of the related arts, it is unable to determine a changing trend of the resistance value (e.g., the trend to reach the target resistance value). As such, even if the resistance value of the RRAM cell is changing in non-expected trend (e.g., increasing instead of decreasing as expected) after each write or reverse write pulse, the write or reverse write operation keeps applying the subsequent write or reverse write pulses. Accordingly, time and power consumption are wasted while the write or reverse operation is eventually failed, thereby reducing the reliability and the performance of the RRAM device.

Along with the popularity of RRAM devices, it is desirable to have a RRAM device, a write verify method and a reverse write verify method that are capable of determining the changing trend of the resistance value of each RRAM cell, thereby saving power consumption, improving the performance of RRAM operations and improving the uniform performance for each RRAM cell.

SUMMARY OF THE INVENTION

This invention introduces a RRAM device, a write verify method and a reverse write verify method which are capable of saving power consumption, improving the performance of RRAM operations and improving the uniform performance for each RRAM cell. The RRAM device may include a plurality of RRAM cells, a comparator, a local counter and a memory controller. The comparator is configured to compare a first resistance value sensed from a RRAM cell among the plurality of RRAM cells with a plurality of reference resistance values to obtain a comparison value. The local counter is coupled to the comparator and is configured to keep a counting value corresponding to the comparison value. The memory controller is configured to perform a set operation on the RRAM cell to change the first resistance value to a second resistance value and compare the second resistance value with the comparison value to determine whether to continue the set operation on the RRAM cell.

The write verify method may include steps of comparing a first resistance value sensed from a RRAM cell with a plurality of reference resistance values to obtain a comparison value; performing a set operation on the RRAM cell by applying a first set pulse to change the first resistance value to a second resistance value; and comparing the second resistance value with the comparison value to determine whether to continue the set operation on the RRAM cell.

The write reverse verify method may include steps of comparing a first resistance value sensed from a RRAM cell with a plurality of reference resistance values to obtain a comparison value; performing a reset operation on the RRAM cell by applying a first reset pulse to change the first resistance value to a second resistance value; and comparing the second resistance value with the comparison value to determine whether to continue the reset operation on the RRAM cell.

In embodiments of the invention, the trend to reach the target resistance value after applying a set pulse or a reset pulse to a RRAM cell is determined and the next step operation on the RRAM cell is determined according to the trend to reach the target resistance value. In this way, the write operation and reverse write operation on the RRAM cell are performed more effectively, and the uniform performance for each RRAM cell is improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
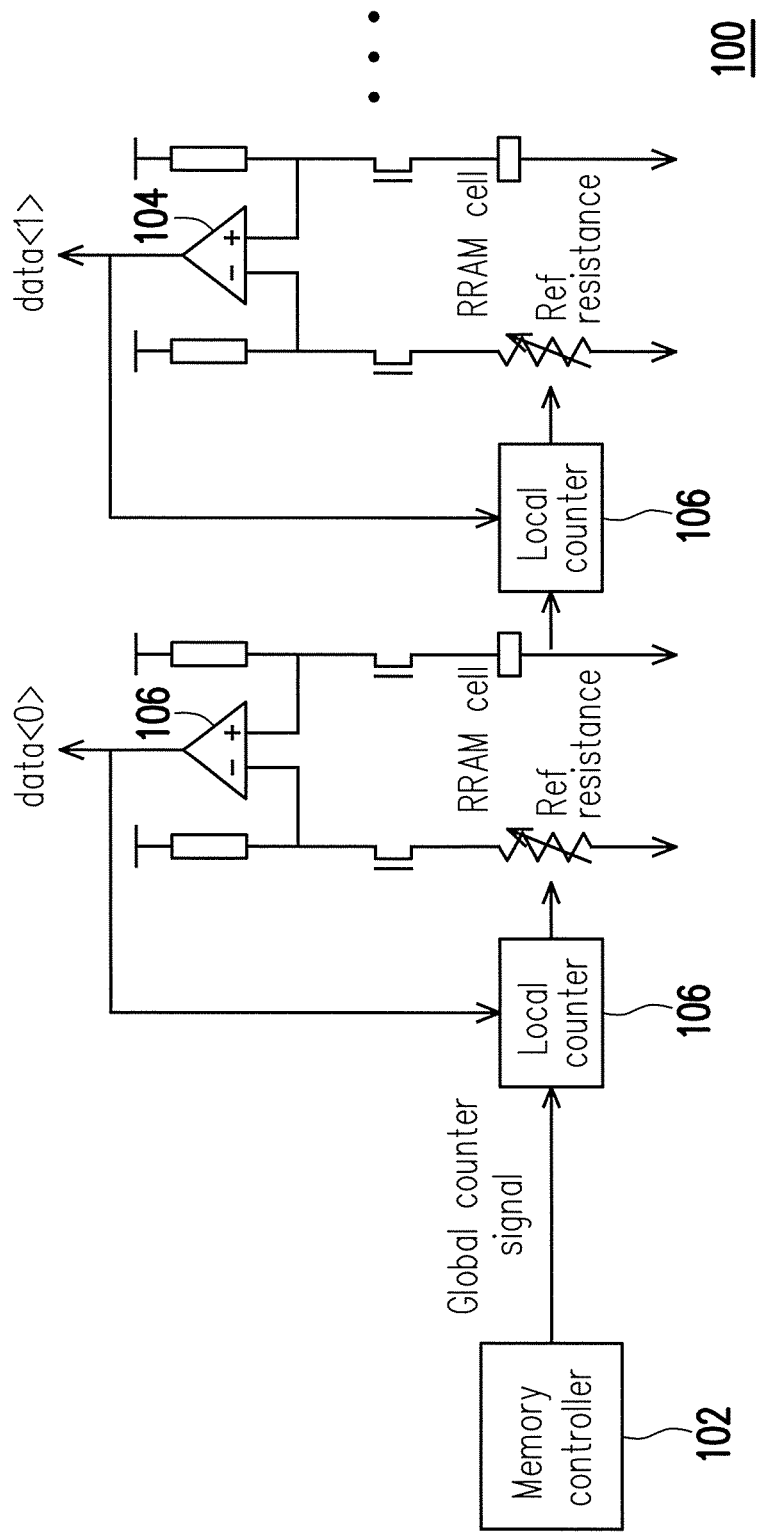
FIG. 1 illustrates a schematic diagram of a RRAM device according to an embodiment of the invention.

Referring to FIG. 1, a RRAM device 100 includes a memory controller 102, a plurality of RRAM cells, a plurality of comparators 104 and a plurality of local counters 106. Each of the comparators 104 is coupled to a RRAM cell among the plurality of RRAM cells, and is configured to compare the resistance value sensed from the RRAM cell with a plurality of reference resistance values Rref to obtain a comparison value. Each of the local counters 106 is coupled to one comparator 104, and is configured to keep a counting value corresponding to the comparison value.

In an embodiment of the invention, the plurality of the reference resistance values is arranged in an increasing order or in a decreasing order, and each of the reference resistance values is corresponded to one counting value of the local counter. The comparison value may be one of the reference resistance values Rref which corresponds to the resistance value sensed from the RRAM cell. For example, the comparison value is the reference resistance value that is closest and smaller than the resistance value sensed from the RRAM cell. In another example, the comparison value is the reference resistance value that is closest and greater than the resistance value sensed from the RRAM cell.

In an embodiment of the invention, each of the local counters 106 is coupled to the memory controller 102 to receive a global counter signal from the memory controller 102. The local counters 106 are controlled by the global counter signal. In other words, all of the local counters receive the same global counter signal, and the value of a local counter corresponds to the resistance value of the RRAM cell that is coupled to the local counter.

Since each local counter 106 may represent the resistance value of the RRAM cell coupled to the local counter 106, the resistance value of the RRAM cell may be monitored in each stage of a write or reverse write operation, thereby determining the trend to reach the target value. For example, a write operation on the RRAM cell may include sequentially applying a number of write pulses to the RRAM cell until the resistance value of the RRAM cell reaches a target write value (target set value). When a write pulse is applied to the RRAM cell, it is expected that the resistance value of the RRAM cell is closer to the target write value (expected trend). As such, if the resistance value of the RRAM cell is not closer or even farther to the target write value after applying the write pulse (non-expected trend), it is likely that the resistance value of the RRAM cell cannot reach the target write value regardless of a number or intensity of write pulses. In this case, it is wasted time and power consumption to keep applying the subsequent write pulses to the RRAM cell whose resistance value is changing in the non-expected trend.

Figure 2A:
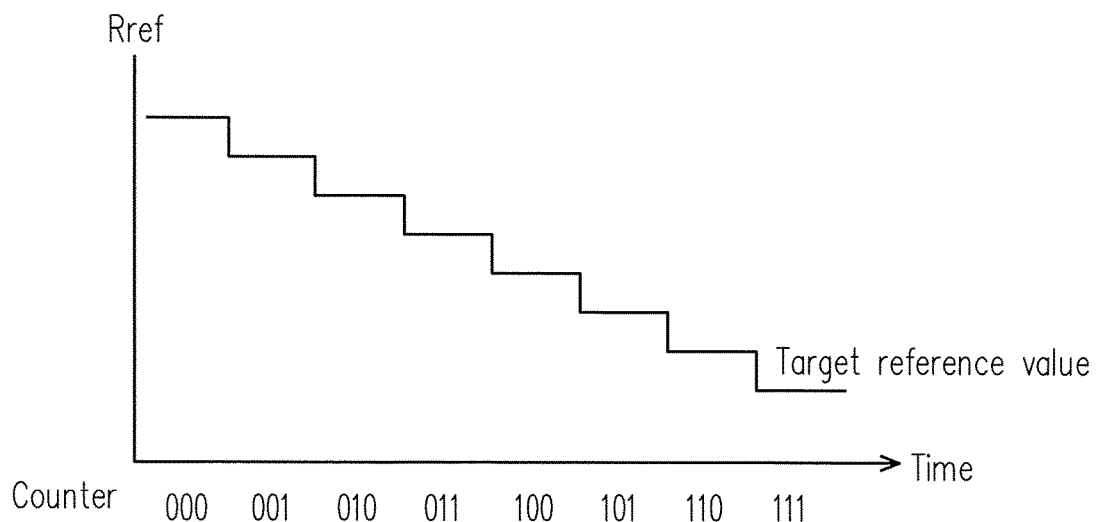
FIGS. 2A-2B illustrate examples of a plurality of reference resistance values arranged in a decreasing order or in an increasing order.
Figure 2B:
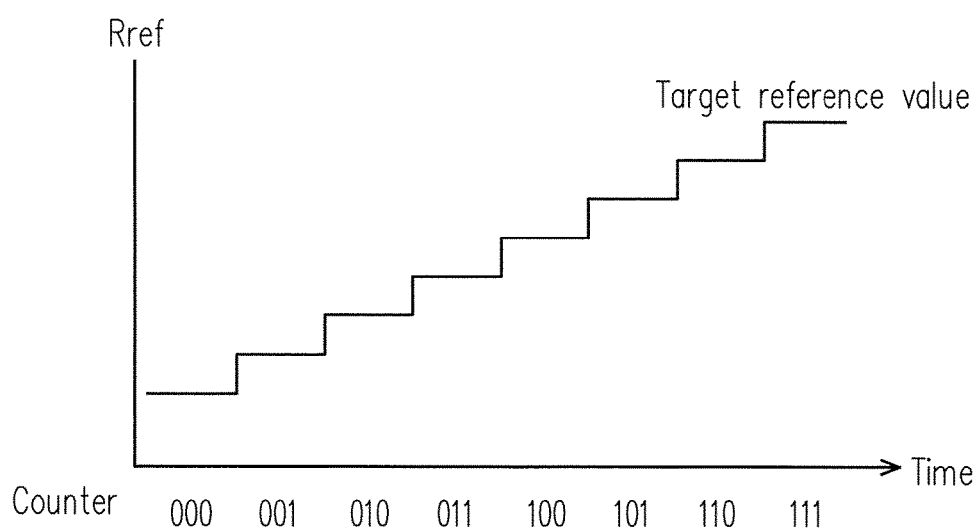

Referring to FIGS. 2A-2B, the vertical axis represents the reference resistance values and the horizontal axis represents time (or counting values of a counter). Each of the reference resistance values is corresponding to one of the counting values which is represented by a binary string of n bits, n is an integer. In FIGS. 2A-2B, each of the counting values are represented by the binary string of 3 bits (e.g., "000", "001", "010", etc), but the invention is not limited thereto. The value of n is selected according to designed requirements.

FIG. 2A illustrates a plurality of reference resistance values arranged in a decreasing order and the target resistance value is one of the reference resistance values. In FIG. 2A, the target resistance value is for write operation and is the smallest reference resistance value among the reference resistance values, but the invention is not limited thereto.

FIG. 2B illustrates a plurality of reference resistance values arranged in an increasing order, where the target resistance value is one of the reference resistance values. In FIG. 2B, the target resistance value is for reverse write operation and is the largest reference resistance value among the reference resistance values, but the invention is not limited thereto.

Figure 3:
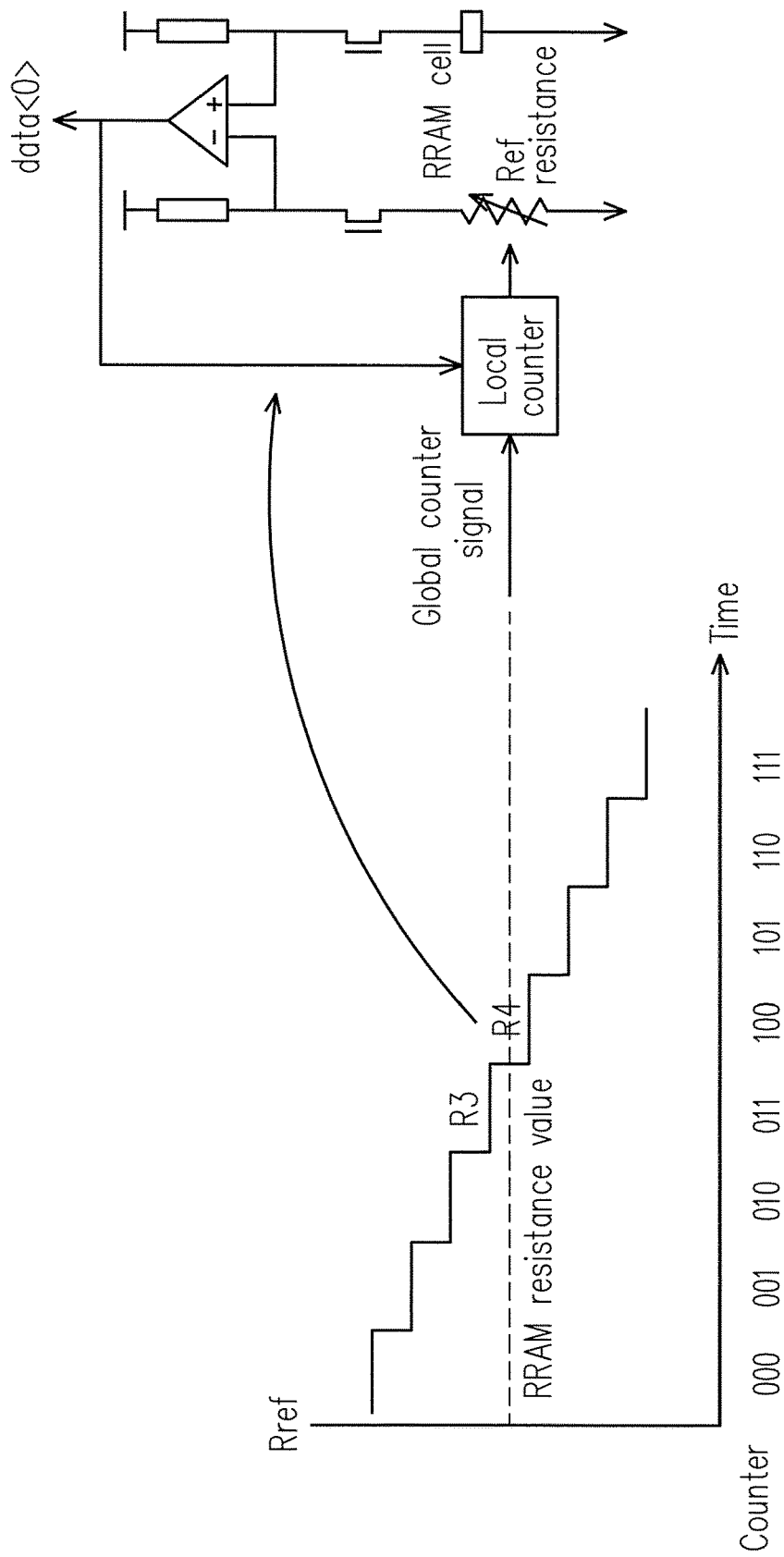
FIG. 3 illustrates a process for determining a counting value corresponding to the resistance value of a RRAM cell according to an embodiment of the invention.

As shown in FIG. 3, the resistance value sensed from the RRAM cell is compared to the plurality of reference resistance values which may be arranged in the decreasing order or in the increasing order to obtain the comparison value. At the time point corresponding to the counting value of "011", the resistance value of the RRAM cell is compared to the reference resistance value R3. At the time point corresponding to the counting value of "100", the resistance value of the RRAM cell is compared to the reference resistance value R4. When it is determined that the resistance value of the RRAM cell is smaller than the reference resistance value R3 and is greater than the reference resistance value R4, the comparison value is R4 and the counting value of "100" corresponding to the R4 is stored in the local counter coupled to the RRAM cell. In other words, the local counter coupled to the RRAM cell keeps its counting value at "100". However, the invention is not limited thereto, the comparison value may be R3 and the counting value of "011" corresponding to R3 may be stored in the local counter coupled to the RRAM cell for the above situation. It should be noted that the reference resistance values in FIG. 3 are arranged in the decreasing order or in the increasing order, and R4 is adjacent to R3.

Figure 4A:
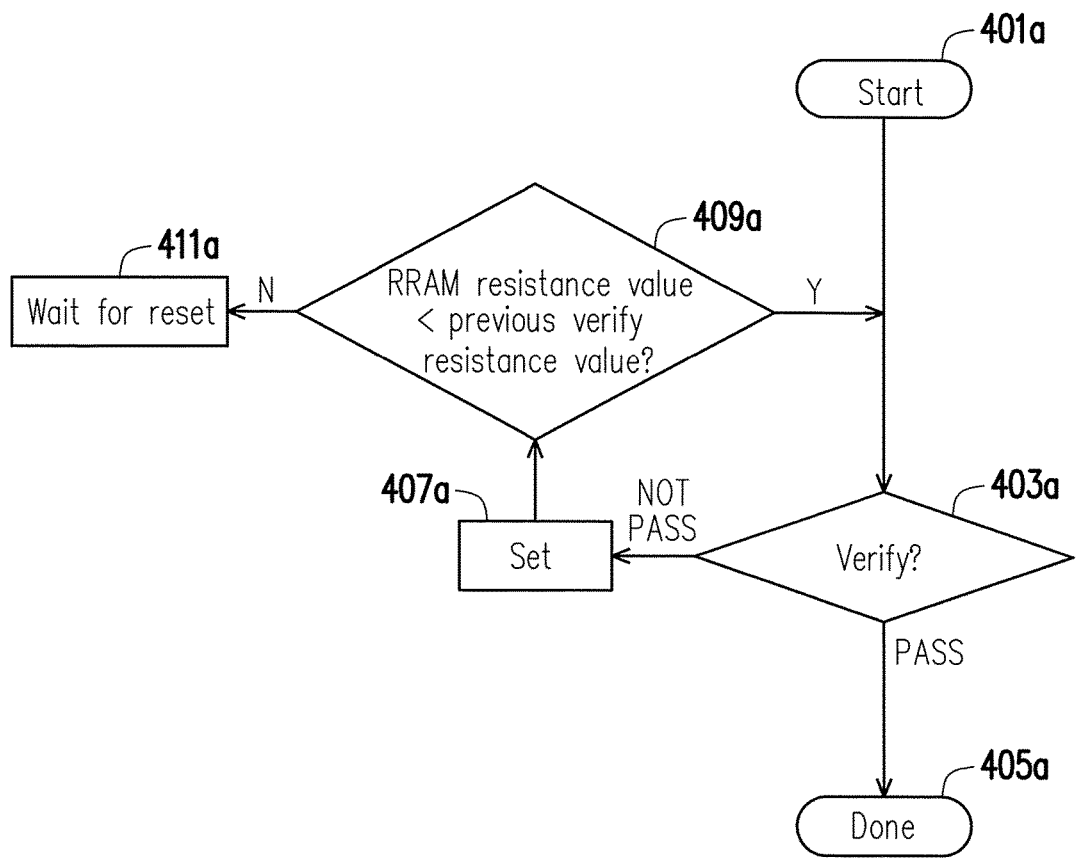
FIGS. 4A-4B illustrates flowchart diagrams of a write operation and a reverse write operation according to an embodiment of the invention.

FIG. 4A illustrates a flowchart diagram of a write operation according to an embodiment of the invention. In step 401a and 403a, a verifying operation is performed to determine the counting value corresponding to the resistance value of the RRAM cell and to determine whether the resistance value of the RRAM cell reaches a target write resistance value. The process for determining the counting value corresponding to the resistance value of the RRAM cell is illustrated in FIG. 3 and described above, thus the detailed description of the process for determining the counting value corresponding to the resistance value of the RRAM cell is omitted herein. After the verifying operation, the local counter coupled to the RRAM cell stores the counting value corresponding to the resistance value of the RRAM cell (e.g., "100" corresponding to R4 in FIG. 3).

In steps 403a, the resistance value of the RRAM cell is compared with the target write resistance value to determine whether the write operation on the RRAM cell is successful. If the resistance value of the RRAM cell reaches the target write resistance value (e.g., the resistance value of the RRAM cell is smaller than or equal to the target write resistance value), the write operation is successful and the write operation is stopped at step 405a. Otherwise, a set operation is performed in step 407a by applying a set pulse to the RRAM cell to change the value of the RRAM cell from a first resistance value to a second resistance value (or current resistance value). It should be noted that the comparison value may be considered as the previous verify resistance value of the RRAM cell.

In steps 409a, the second resistance value of the RRAM cell (current resistance value) is compared to the comparison value (previous verify resistance value) to determine the changing trend of the RRAM cell's resistance value. If the current resistance value is smaller than the previous verify resistance value, it indicates that the resistance value of the RRAM cell is changing in the expected trend (toward the target write resistance value). As such, the set operation should be continued to be performed until the resistance value of the RRAM cell reaches the target write resistance value. On the other hand, if the current resistance value is greater than the previous verify resistance value after applying the set pulse, it indicates that the resistance value of the RRAM cell is changing in non-expected trend (not toward the target write resistance value). In this case, the set operation should not be continued and a reset flag is set to the RRAM cell in step 411*a* so that the RRAM cell will be reset after set operations for other RRAM cells are completed.

Figure 4B:
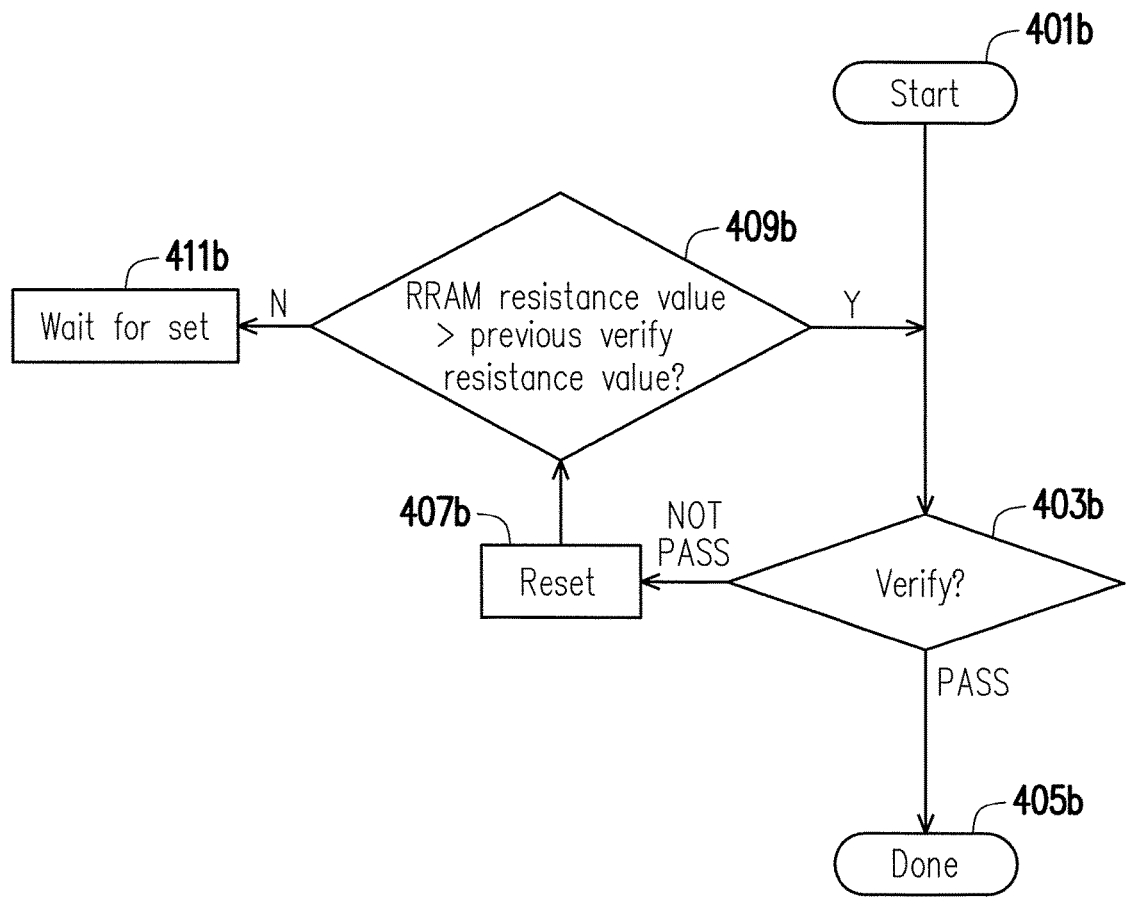

FIG. 4B illustrates a flowchart diagram of a reverse write operation according to an embodiment of the invention. Steps 401*b*, 403*b* and 405*b* are similar to the steps 401*a*, 403*a* and 405*a*, thus the detailed description of the steps 401*b*, 403*b* and 405*b* are omitted herein.

If the resistance value of the RRAM cell has not reached the reset target resistance value yet, a reset operation is performed on step 407*b* to change the resistance value of the RRAM cell from a first resistance value to a second resistance. In step 409*b*, the current resistance value is compared with the previous verify resistance value to determine the changing trend of the RRAM cell's resistance value. If the current resistance value is greater than the previous verify resistance value, it indicates that the resistance value of the RRAM cell is changing in the expected trend. As such, the reset operation should be continued to be performed until the resistance value of the RRAM cell reaches the target reverse write resistance value. On the other hand, if the current resistance value is smaller than the previous verify resistance value after applying the reset pulse, it indicates that the resistance value of the RRAM cell is changing in the non-expected trend. In this case, the reset operation should not be continued and a set flag is set to the RRAM cell in step 411*b* so that the RRAM cell will be set after reset operations for other RRAM cells are completed.

Figure 5A:
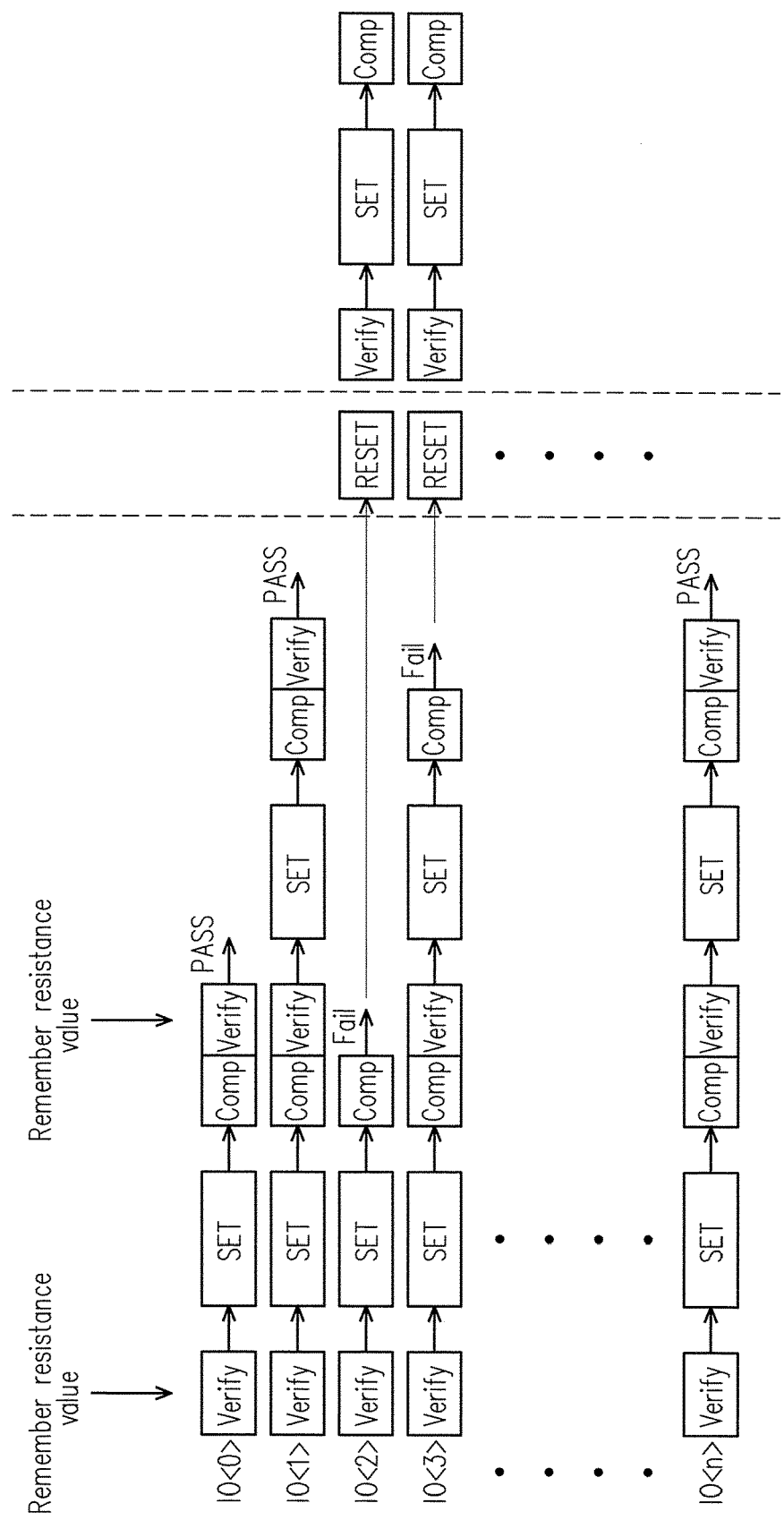
FIGS. 5A-5B illustrate diagrams of a write operation and a reverse write operation according to embodiments of the invention.

FIG. 5A illustrates a diagram of a write operation according to an embodiment of the invention. The resistance values of different RRAM cells outputted from the IO<0> to IO<n> are verified with the verifying operation to determine the counting value of the local counter corresponding to the resistance value of each of the RRAM cells and to determine whether the resistance value of the RRAM cells reaches the target write resistance value. In other words, the resistance value of each of the of RRAM cells is remembered in the local counter. After performing a set operation by applying a set pulse on the RRAM cells, the current resistance value of the RRAM cell is compared with the previous verify resistance value which is remembered in the local counter to determine the changing trend of the resistance value.

If the changing trend is the expected trend or the resistance value of the RRAM cell is changing toward the target write resistance value, the set operation is continued by applying subsequent set pulses. If the changing trend is the non-expected trend or the resistance value of the RRAM is not changing toward the target write resistance value, the set operation is stopped and the RRAM cell is waited for resetting after the set operations on the other RRAM cells are completed. After performing the reset operation on the RRAM cells that is waiting for resetting, these RRAM cells are re-performed with verifying operation and the set operation as described above.

Figure 5B:
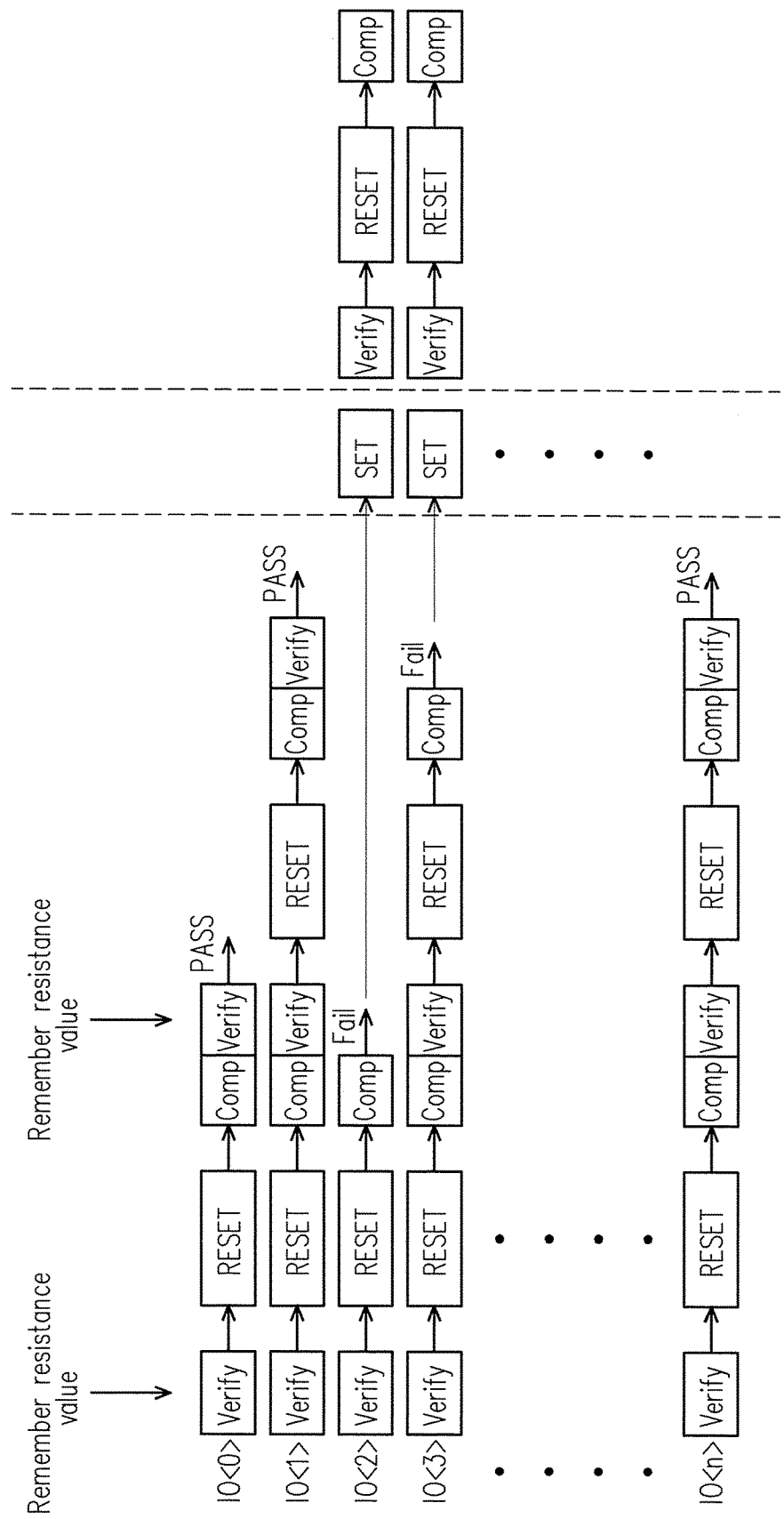

FIG. 5B illustrates a diagram of a reset operation according to an embodiment of the invention. The resistance values of different RRAM cells outputted from the IO<0> to IO<n> are verified with the verifying operation to determine the counting value of the local counter corresponding to the resistance value of each of the RRAM cells and to determine whether the resistance value of the RRAM cells reaches the target reverse write resistance value. After performing a reset operation by applying a reset pulse on the RRAM cells, the current resistance value of the RRAM cell is compared with the previous verify resistance value which is remembered in the local counter to determine the changing trend of the resistance value.

If the changing trend is the expected trend or the resistance value of the RRAM cell is changing toward the target reverse write resistance value, the reset operation is continued by applying subsequent reset pulses. If the changing trend is the non-expected trend or the resistance value of the RRAM is not changing toward the target reverse write resistance value, the reset operation is stopped and the RRAM cell is waited for a set operation after the reset operations on the other RRAM cells are completed. After performing the set operation on the RRAM cells that is waiting for the set operation, these RRAM cells are re-performed with verifying operation and the reset operation as described above.

Figure 6:
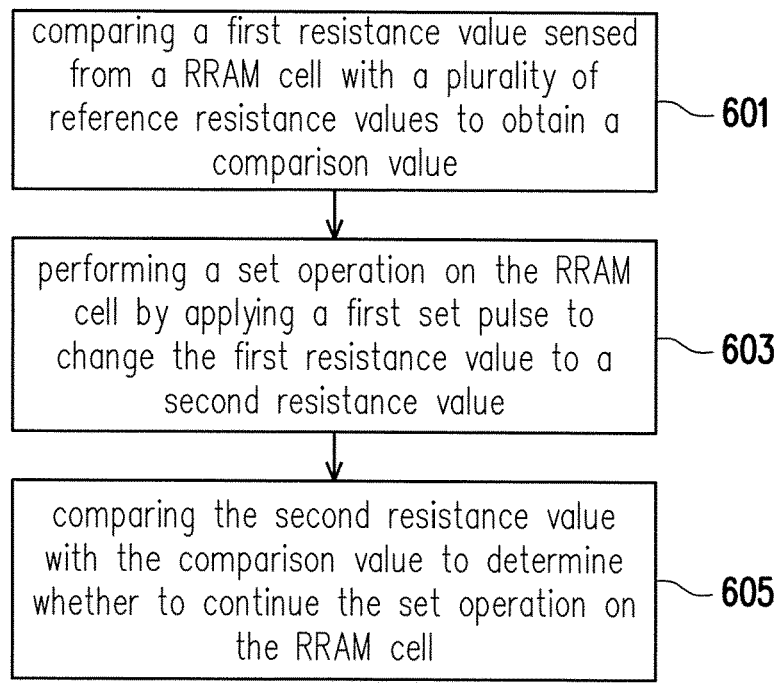
FIG. 6 illustrates a write verify method according to an embodiment of the invention.

Referring to FIG. 6, in step 601, a first resistance value sensed from a RRAM cell is compared with a plurality of reference resistance values to obtain a comparison value. In step 603, a set operation is performed on the RRAM cell by applying a first set pulse to change the first resistance value to a second resistance value. Next, in step 605, the second resistance value is compared with the comparison value to determine whether to continue the set operation on the RRAM cell. In this way, the write verify method may determine the changing trend of the resistance value of the RRAM cell, thereby deciding the next step operation for the RRAM cell.

Figure 7:
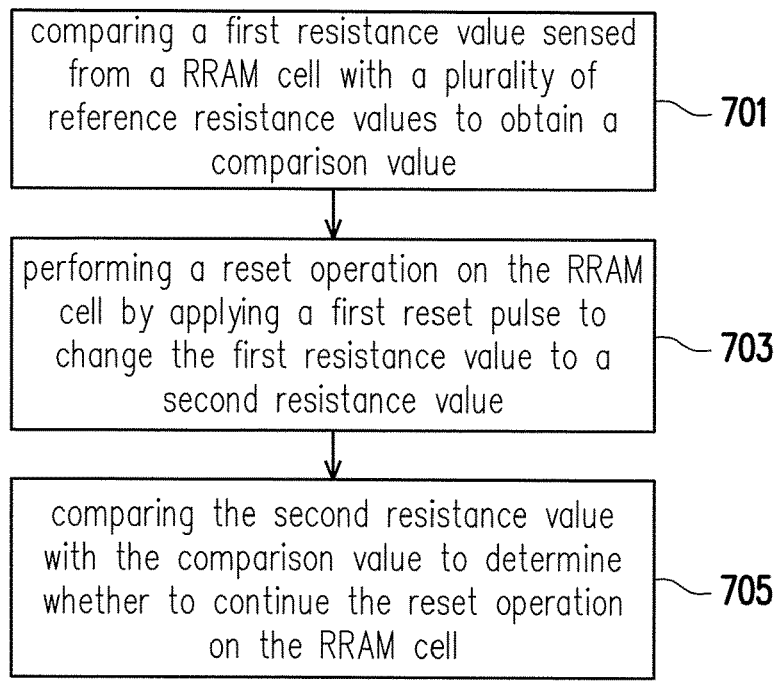
FIG. 7 illustrates a reverse write verify method according to an embodiment of the invention.

Referring to FIG. 7, in step 701, a first resistance value sensed from a RRAM cell is compared with a plurality of reference resistance values to obtain a comparison value. In step 703, a reset operation is performed on the RRAM cell by applying a first reset pulse to change the first resistance value to a second resistance value. In Step 705, the second resistance value is compared with the comparison value to determine whether to continue the reset operation on the RRAM cell. In this way, the reverse write verify method may determine the changing trend of the resistance value of the RRAM cell, thereby deciding the next step operation for the RRAM cell.

In summary, the embodiments of the invention introduce a RRAM device, a write verify method and a reverse write verify method which are capable of determining the changing trend of the resistance value in a set operation or a reset operation, thereby deciding the next step operation. Particularly, a first resistance value of the RRAM cell is remembered and stored in a local counter coupled to the RRAM cell. After the set pulse or a reset pulse is applied to the RRAM cell to change the resistance value of the RRAM cell from the first resistance value to the second resistance value (current resistance value), the current resistance value is compared with the previous verify resistance value to determine the changing trend of the resistance value (whether the resistance value changes toward the target resistance value). When the resistance value of the RRAM cell is moving toward the target resistance value (expected trend), the set operation or the reset operation is continued. When the resistance value of the RRAM cell is not changing toward the target resistance value (or in non-expected trend), the set operation or the reset operation is stopped and the RRAM cell operation is waited for setting or resetting. In this way, the invention may save time and power consumption for subsequent set or reset pulses on the RRAM cells whose the resistance value is changing in the non-expected trend. Furthermore, the write operation and reverse write operation on the RRAM cell are performed more effectively, and the uniform performance for each RRAM cell is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A write verify method of a resistance random access memory (RRAM) device, comprising:
   comparing a first resistance value sensed from a RRAM cell with a plurality of reference resistance values to obtain a comparison value;
   performing a first set operation on the RRAM cell by applying a first set pulse to change the first resistance value to a second resistance value;
   comparing the second resistance value with the comparison value to determine whether to continue the first set operation on the RRAM cell;
   determining that the second resistance value is not smaller than the comparison value, stopping the first set operation on the RRAM cell and setting a reset flag for the RRAM cell;
   performing a second set operation on other RRAM cell in the RRAM device;
   performing a reset operation on the RRAM cell that has the reset flag after the second set operation on the other RRAM cell is completed;
   performing a third set operation on the RRAM cell that has the reset flag after the reset operation on the RRAM cell is completed; and
   determining whether the first resistance value is smaller than a first reference resistance value and greater than a second reference resistance value,
   when the first resistance value is smaller than the first reference resistance value and greater than the second reference resistance value, keeping a local counter of the RRAM cell at a counting value corresponding to the second reference resistance value, and setting the second reference resistance value to the comparison value.

2. The write verify method according to claim 1, wherein the plurality of reference resistance values is arranged in a decreasing order or an increasing order to generate a sequence of reference resistance values, and each of the plurality of reference resistance values is corresponded to the counting value of the local counter.

3. The write verify method according to claim 2, wherein the local counter is controlled by a global counter signal, and the counting value is represented by a binary string of n bits, n is an integer.

4. The write verify method according to claim 2, wherein the step of determining whether the first resistance value is smaller than the first reference resistance value and greater than the second reference resistance value comprises:
   wherein the first reference resistance value and the second reference resistance value are two of the plurality of reference resistance values, and the first reference resistance value is adjacent to the second reference resistance value in the sequence of reference resistance values.

5. The write verify method according to claim 1, wherein the step of comparing the second resistance value with the comparison value to determine whether to continue the first set operation on the RRAM cell comprises:
   in response to determining that the second resistance value is smaller than the comparison value, performing a verifying operation to determine whether the second resistance value reaches a target write resistance value.

6. The write verify method according to claim 5, wherein the step of performing the verifying operation comprises: indicating that the first set operation on the RRAM cell is successful if the second resistance value reaches the target write resistance value; and
   continuing performing the first set operation by applying a second set pulse to the RRAM cell if the second resistance value does not reach the target write resistance value.

7. A reverse write verify method of a resistance random access memory (RRAM) device, comprising:
   comparing a first resistance value sensed from a RRAM cell with a plurality of reference resistance values to obtain a comparison value;
   performing a first reset operation on the RRAM cell by applying a first reset pulse to change the first resistance value to a second resistance value;
   comparing the second resistance value with the comparison value to determine whether to continue the first reset operation on the RRAM cell;
   determining that the second resistance value is not greater than the comparison value, stopping the first reset operation and setting a set flag for the RRAM cell;
   performing a second reset operation on other RRAM cell in the RRAM device;
   performing a set operation on the RRAM cell that has the set flag after the first reset operation on the other RRAM cell is completed;
   performing a third reset operation on the RRAM cell that has the set flag after the set operation on the RRAM cell is completed; and
   determining whether the first resistance value is smaller than a first reference resistance value and greater than a second reference resistance value,
   when the first resistance value is smaller than the first reference resistance value and greater than the second reference resistance value, keeping a local counter of the RRAM cell at a counting value corresponding to the first reference resistance value, and setting the first reference resistance value to the comparison value.

8. The reverse write verify method according to claim 7, wherein the plurality of reference resistance values is arranged in a decreasing order or an increasing order to generate a sequence of reference resistance values, and each of the plurality of reference resistance values is corresponded to the counting value of the local counter.

9. The reverse write verify method according to claim 8, wherein the local counter is controlled by a global counter signal, and the counting value is represented by a binary string of n bits, n is an integer.

10. The reverse write verify method according to claim 8, wherein the step of determining whether the first resistance value is smaller than the first reference resistance value and greater than the second reference resistance value comprises:
    wherein the first reference resistance value and the second reference resistance value are two of the plurality of the plurality of reference resistance values, and the first reference resistance value is adjacent to the second reference resistance value in the sequence of reference resistance values.

11. The reverse write verify method according to claim 7, wherein the step of comparing the second resistance value with the comparison value to determine whether to continue the first reset operation on the RRAM cell comprises:
    in response to determining that the second resistance value is greater than the comparison value, performing a verifying operation to determine whether the second resistance value reaches a target reverse write resistance value.

12. The reverse write verify method according to claim 11, wherein the step of performing the verifying operation comprises:
   indicating that the first reset operation on the RRAM cell is successful if the second resistance value reaches the target reverse write resistance value; and
   continuing performing the first reset operation by applying a second reset pulse to the RRAM cell if the second resistance value does not reach the target reverse write resistance value.

13. A resistive random access memory (RRAM) device, comprising:
   a plurality RRAM cells;
   a comparator, configured to compare a first resistance value sensed from a RRAM cell among the plurality of RRAM cells with a plurality of reference resistance values to obtain a comparison value;
   a local counter, coupled to the comparator and configured to keep a counting value corresponding to the comparison value;
   a memory controller, configured to perform a first set operation on the RRAM cell to change the first resistance value to a second resistance value, compare the second resistance value with the comparison value to determine whether to continue the first set operation on the RRAM cell, determining the second resistance value is not smaller than the comparison value, stopping the first set operation on the RRAM cell and setting a reset flag for the RRAM cell, perform a second set operation on other RRAM cell in the RRAM device, perform a reset operation on the RRAM cell that has the reset flag after the second set operation on the other RRAM cell is completed and perform a third set operation on the RRAM cell that has the reset flag after the reset operation on the RRAM cell is completed,
   determining whether the first resistance value is smaller than a first reference resistance value and greater than a second reference resistance value, when the first resistance value is smaller than a first reference resistance value and greater than a second reference resistance value, keeping a local counter of the RRAM cell at a counting value corresponding to the second reference resistance value, and setting the second reference resistance value to the comparison value.

14. The RRAM device according to claim 13, a memory controller is further configured to provide a global counter signal to the local counter to control the local counter.

15. The RRAM device according to claim 13, wherein the plurality of reference resistance values is arranged in a decreasing order or an increasing order to generate a sequence of reference resistance values, and each of the plurality of reference resistance values is corresponded to the counting value of the local counter.

16. The RRAM device according to claim 13, the memory controller is further configured to perform a verifying operation to determine whether the second resistance value reaches a target write resistance value in response to determining that the second resistance value is smaller than the comparison value.

* * * * *